United States Patent [19]

Bowen

[11] Patent Number: 5,602,387
[45] Date of Patent: Feb. 11, 1997

[54] METHOD OF PROTECTING AN RF RECEIVER IN A HOSTILE ELECTROMAGNETIC ENVIRONMENT

[75] Inventor: Tracey S. Bowen, Albuquerque, N.M.

[73] Assignee: The United States of America as represented by the Secretary of the Air Force, Washigton, D.C.

[21] Appl. No.: 494,859

[22] Filed: Jun. 26, 1995

[51] Int. Cl.$^6$ ....................................................... H01J 5/16
[52] U.S. Cl. ................. 250/227.17; 250/227.11; 324/96; 343/721
[58] Field of Search ............. 250/227.17, 227.11, 250/227.19; 324/96, 44, 244.1, 244; 343/703, 721, 754

[56] References Cited

U.S. PATENT DOCUMENTS

| | | | |
|---|---|---|---|
| 4,376,248 | 3/1983 | Giallorenzi et al. | 250/277.19 |
| 5,068,616 | 11/1991 | Broyde et al. | 324/627 |
| 5,210,407 | 5/1993 | Ito et al. | 250/227.11 |
| 5,243,186 | 9/1993 | Hilliard et al. | 250/227.17 |
| 5,365,237 | 11/1994 | Johnson et al. | 342/179 |
| 5,389,782 | 2/1995 | Hilliard | 250/227.17 |

*Primary Examiner*—Que T. Le
*Attorney, Agent, or Firm*—Robert L. Nathans

[57] ABSTRACT

A photonic electro-optic field sensor is positioned adjacent a metallic antenna. Polarized light is passed through the field sensor, and the degree of rotation thereof is proportional to the strength of the RF signal sensed by the antenna. The resulting modulated light signal is transmitted via an optical fiber cable to a remote signal processor and is photodetected before further processing by the shielded processor electronics.

1 Claim, 1 Drawing Sheet

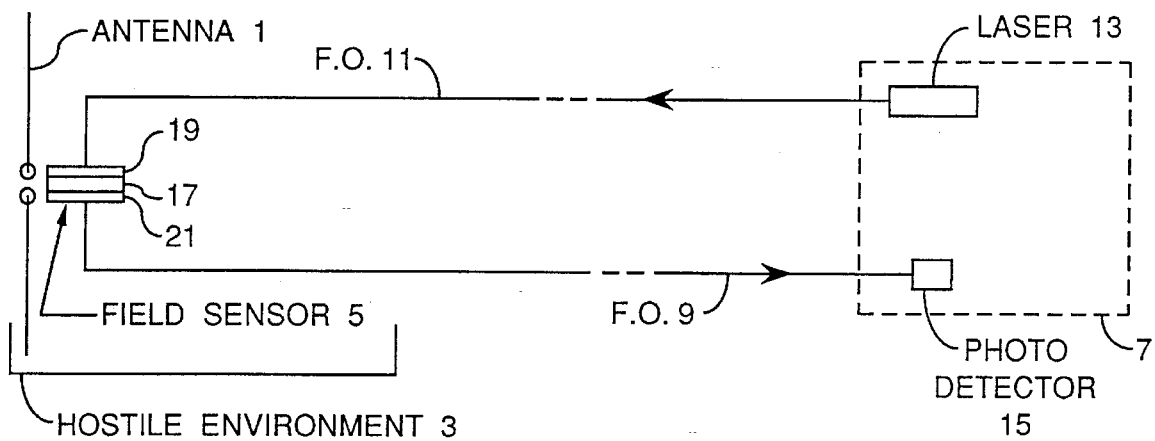

METHOD OF PROTECTING AN RF RECEIVER IN A HOSTILE ELECTROMAGNETIC ENVIRONMENT

STATEMENT OF GOVERNMENT INTEREST

The invention described herein may be made by or for the Government for governmental purposes without the payment of any royalty thereon.

BACKGROUND OF THE INVENTION

There is a need for a method of detecting and measuring electromagnetic (EM) microwave radiation in a potentially hostile EM environment, which method would protect sensitive conventional electronic components, ancillary to a signal receiving seeker/antenna from damage. Such sensitive components include widely utilized impedance transforming baluns connected directly to the antenna feed regions. This component damage is due to the presence of excessive voltage stresses of very high strength EM fields impinging upon the signal receiving antenna deployed within such hostile environment. There is also a need for providing a metallic receiving antenna unit which would be very lightweight, while being rugged and impervious to the detrimental effects of the very high strength EM fields. There is also a need to reduce the possibility of unwanted or stray radio frequency radiation being introduced into the electronic signal processor coupled to the antenna.

BRIEF SUMMARY OF A PREFERRED EMBODIMENT OF THE INVENTION

The aforesaid needs have been met by deploying a rugged microwave antenna having no ancillary electronic circuitry which could be subjected to burnout in a hostile EMF environment. At least one electro-optic radiation field sensor is positioned adjacent the antenna and transmits light signals which are modulated in accordance with the properties of the EM field sensed by the antenna, such as field intensity, to a remote signal processor, via a lightweight fiber optic cable. The use of this lightweight and large bandwidth fiber optic cable, in contrast to far heavier and lower bandwidth conventional coaxial cable, enables the signal processor to be positioned a substantial distance away from the antenna. This makes it easier to protect and shield the remote signal processor electronics from potentially destructive high field strength electromagnetic interference (EMI) and radio frequency interference (RFI) present within the hostile EMF environment where the antenna is employed.

BRIEF DRAWING DESCRIPTION

The sole FIGURE schematically illustrates one embodiment of the invention employing polarized light being modulated by the RF field of the antenna.

DETAILED DESCRIPTION OF PREFERRED EMBODIMENTS OF THE INVENTION

In the sole FIGURE, a metallic RF receiving antenna 1, such as a dipole antenna having no conventional ancillary electronic circuitry, is positioned within the potentially hostile EMF environment 3. At least one electro-optic EM field sensor 5 is positioned adjacent antenna 1 and could comprise a variable birefringement crystal medium 17 such as barium titanate, optically coupled to a conventional polarizer 19 and analyzer 21. The aforesaid remotely located electronic signal processor 7 can include a light source such as laser 13, which can transmit a light pulse to the EM field sensor 5 via fiber optic filament 11. The light pulse could be polarized by polarizer 19, and passed through birefringence crystal medium 17 and analyzer 21 to be retransmitted back to processor 7 via fiber optic filament 9. However, a preferred light source 13 would be a CW or pulsed polarized laser, thus eliminating the need for polarizer 19.

The birefringement properties of crystal medium 17 changes when illuminated by microwave radiation. The amplitude of the polarized light passing through this medium, when properly compensated, can be directly modulated by the strength of the microwave field. Hence, EM field sensor 5, when coupled to the antenna, functions as an electro-optic modulator. The type of information obtained, whether CW or pulsed, will depend on the data acquisition and processing apparatus used. The amplitude modulated signal can be relayed back to photodetector 15 from the analyzer 21, via fiber optic strand 9. Thus, the sensed signal can be electronically processed by readily shielded processor circuitry remote from the potentially hostile environment otherwise capable of producing circuit burnout.

An electro-optic radiation field sensor is already marketed by, for example, Terametrics, Inc., and includes a "probe tip" which is very small and can have a dimension of 1×2 mm. The signal produced by photodetector 15 can then be used in conjunction with wideband CW or pulsed acquisition instrumentation in order to extract the desired measurement information. This instrumentation could include the components to process, display and archive the received data.

The invention is to be defined solely by the terms of the following claims and art recognized equivalents thereof, since numerous variations of the foregoing will occur to those skilled in the art. For example, the polarizer shown could be eliminated if laser 13 generates polarized light and fiber 11 is designed to maintain the polarization of light passing therethrough.

What is claimed is:

1. A method of detecting radio frequency signals within a potentially hostile electromagnetic environment comprising the steps of:

(a) positioning a metallic radio frequency signal detecting antenna within said potentially hostile electromagnetic environment, said antenna having no ancillary electronic circuitry subject to burnout due to very high strength fields within said potentially hostile electromagnetic environment;

(b) positioning an electro-optic field sensor adjacent said antenna and electrically coupled thereto;

(c) transmitting an interrogating light beam through a fiber optic cable from a remote processing site to and through said electro-optic field sensor;

(d) transmitting a modulated light beam passed through said electro-optic field sensor back through a fiber optic cable to said remote site; and (e) detecting at said remote site, the degree of modulation of said modulated light beam caused by a radio frequency signal sensed by said antenna.

* * * * *